United States Patent [19]

Hope

[11] Patent Number: 4,486,816
[45] Date of Patent: Dec. 4, 1984

[54] HOUSING FOR RECEIVING AND STORING PRINTED CIRCUIT BOARDS

[75] Inventor: George P. Hope, Lancaster, Pa.
[73] Assignee: RCA Corporation, New York, N.Y.
[21] Appl. No.: 443,661
[22] Filed: Nov. 22, 1982
[51] Int. Cl.³ ............................................. H05K 7/14
[52] U.S. Cl. ..................................... 361/399; 211/41;
 339/65; 361/395; 361/415; 361/413; 361/429
[58] Field of Search ............... 361/395, 399, 415, 429;
 339/17 M, 17 LM, 65, 66 M; 211/41, 189

[56] References Cited

U.S. PATENT DOCUMENTS

| | | | |
|---|---|---|---|
| 3,368,115 | 2/1968 | Hoffman | 317/101 |
| 3,489,954 | 1/1970 | Humphrey, Jr. et al. | 317/101 |
| 3,511,385 | 5/1970 | Ayling | 361/429 |
| 3,529,213 | 9/1970 | Farrand | 317/101 |
| 3,704,394 | 11/1972 | Johnson | 317/101 |
| 3,838,777 | 10/1974 | Thornicroft et al. | 211/41 |
| 4,013,928 | 3/1977 | Sarinopoulos et al. | 361/429 |
| 4,328,898 | 5/1982 | Grassi | 211/41 |

OTHER PUBLICATIONS

"RCA Microboard Industrial Chassis Series," RCA Solid State, MB-8, Feb. 1982, pp. 1-12.

Primary Examiner—A. D. Pellinen
Assistant Examiner—Gregory D. Thompson
Attorney, Agent, or Firm—Joseph S. Tripoli; George E. Haas; William Squire

[57] ABSTRACT

A housing for receiving and storing printed circuit boards comprises a first pair of interconnect elements at the rear of the housing and a second pair of interconnect elements at the front of the housing end. A connector backplane assembly including a plurality of printed circuit board connectors is slidably engaged with the first pair of elements. Circuit board guides are each engaged with one of the first pair and one of the second pair of interconnect elements. Side plates secured to the interconnect elements lock the guides and the backplane assembly in place.

17 Claims, 10 Drawing Figures

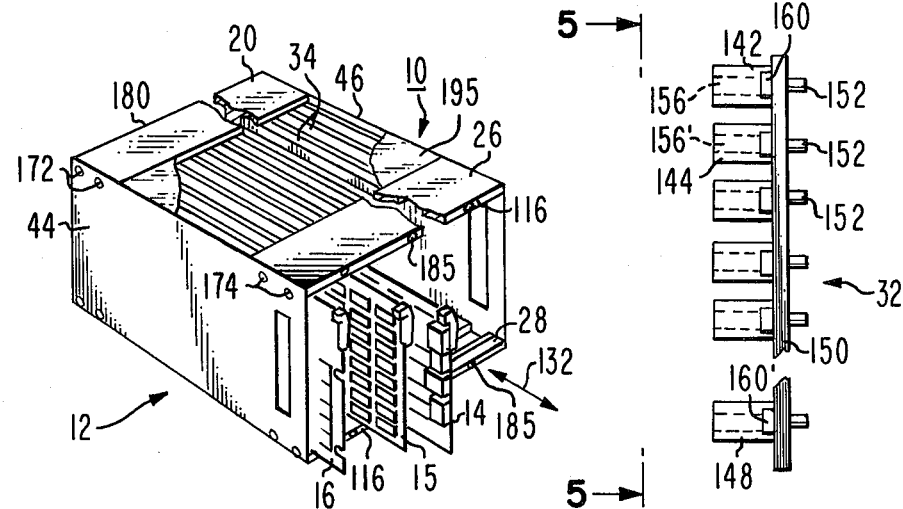
Fig. 1
Fig. 4
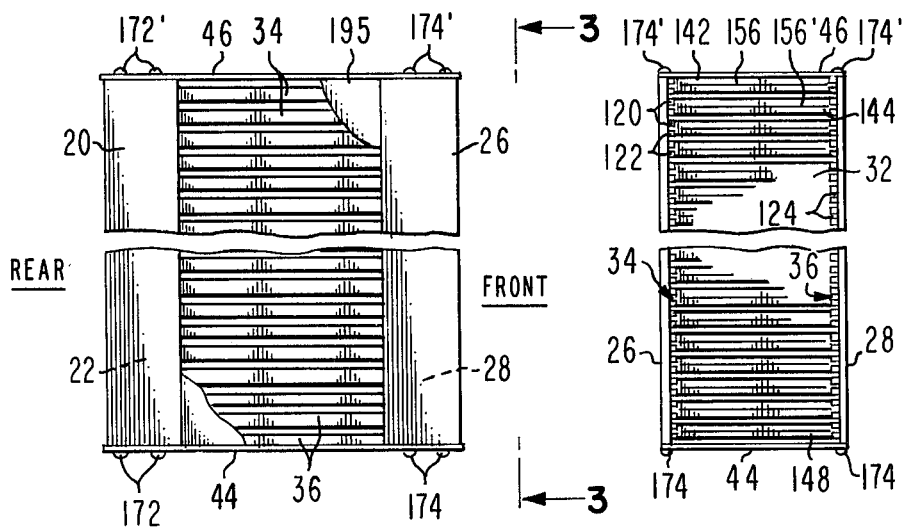
Fig. 2
Fig. 3

HOUSING FOR RECEIVING AND STORING PRINTED CIRCUIT BOARDS

BACKGROUND OF THE INVENTION

This invention relates to a housing for receiving and storing printed circuit boards and for coupling the printed circuit boards to corresponding connectors.

Housings for printed circuit board assemblies including a backplane assembly with connectors for electrically interconnecting the circuit board assemblies are widely used. The printed circuit board assemblies comprise electrical components mounted on printed circuit boards. The housings include a frame guide rail structure for slidably receiving and guiding a printed circuit board assembly along a given path within the housing and for supporting the printed circuit board assembly in a given aligned position. The backplane assembly comprises a printed circuit board and an array of printed circuit board connectors, each connector receiving an edge of the board of the printed circuit board assembly. The connectors have contact pins extending from the connector body. The contact pins are often soldered to the backplane printed circuit board conductors. The printed circuit board assemblies are stacked in the housing one above the other in parallel fashion, or side by side vertically. Examples of frames and housings for holding printed circuit board assemblies are shown in U.S. Pat. Nos. 3,368,115; 3,489,954; 3,704,394; 3,838,777; and 4,328,898. The problem generally with these prior art frames and housings is that they tend to require fasteners, e.g., screws, to attach the backplane assembly to the guide rail structure. This tends to be cumbersome to assemble and does not lend itself to modular arrangements in that screw holes of different elements such as a frame and a backplane assembly usually need to be aligned and require additional fabrication and time consuming assembly steps.

SUMMARY OF THE INVENTION

In accordance with the present invention the need for screw type fasteners is reduced in housing a for securing an storing at least one printed circuit board. The housing comprises a first pair of like interconnect elements which have like first channels and like second channels. The channels extend generally parallel to each other along the length of the element. A second pair of like interconnect elements have like third channels extending along their length. Means coupled to the elements secure the elements in spaced relation, the first pair of elements being parallel spaced with the first channels facing each other and generally at one end of the assembly and the second pair of elements being parallel spaced and generally at an end opposite the one end, with a first of the first pair of elements generally coplanar with a first of the second pair of elements and a second of the first pair of elements generally coplanar with a second of the second pair of elements, and with the second channels of the first pair of elements facing the third channels. Guide means slidably receive the printed circuit board and include tab means engaged in the second and third channels for securing the guide means to the elements. Guide positioning means are received in the second and third channels for positioning the guide means relative to said elements. Backplane means include connector means engaged with the first channels and means for aligning the connector means with the guide means.

BRIEF DESCRIPTION OF THE DRAWING

FIG. 1 is a perspective view of a housing for securing and storing printed circuit boards embodying the present invention;

FIG. 2 is a plan view of the housing of FIG. 1;

FIG. 3 is a front elevation view of the housing of FIG. 1 in which the chassis is standing on a side;

FIG. 4 is a plan view of a connector assembly structure employed in the assembly of FIG. 1;

DETAILED DESCRIPTION

Figure 7:
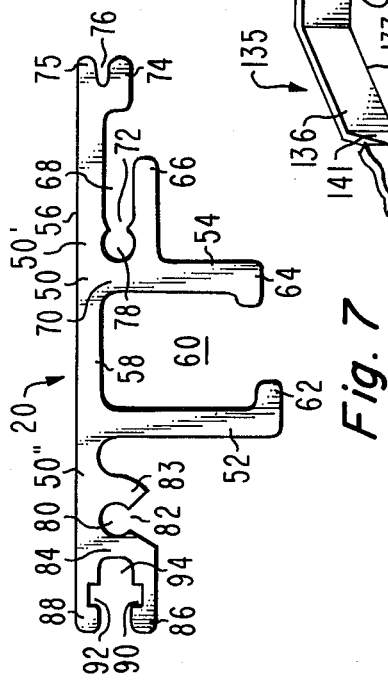
FIG. 7 is an end view of an interconnect element employed in the embodiment of FIG. 1.

In FIG. 1 chassis assembly 10 includes a housing 12 for receiving and storing a plurality of printed circuit board assemblies 14, 15, and 16 partially inserted in the housing 12. The housing 12 includes side plates 44 and 46 and end plates 180 and 194 (not shown in FIG. 1). Side plate 44 in FIG. 1 is omitted for simplicity of illustration in FIG. 6.

Referring to FIGS. 1, 2, 3, and 6, the housing 12 comprises a first pair of interconnect elements 20, 22 which lie in a plane located at the housing 12 rear end 24 and a second pair of interconnect elements 26, 28 which lie in a plane located at the housing 12 front end 30. The plane of elements 26, 28 is parallel to the plane of elements 20, 22. A connector backplane assembly 32 is coupled to the elements 20 and 22 at rear end 24 as will be explained more fully below. A first horizontally spaced array of printed circuit board guides 34 are connected to and between elements 20 and 26 on the top of the housing 12. A second horizontally spaced array of guides 36 is connected to elements 22 and 28 at the bottom of the housing 12.

Printed circuit board assembly 16, which is representative of the other printed circuit board assemblies, comprises a plurality of printed metallized conductor paths (not shown) on an insulating and supporting substrate to which are attached electrical components 37 interconnected by the metallized conductor paths. The printed circuit board assemblies 14, 15, and 16 within housing 12 are aligned vertically in FIGS. 1 and 6 and are parallel to each other. This is by way of example, as they could also be horizontal. The edge area of each board assembly, such as edge area 40 of assembly 16 in FIG. 6 has contact conductors (not shown) which are aligned with the corresponding contact elements in a corresponding connector, such as connector 142, of the backplane assembly 32. The printed circuit board assembly 16 and the connectors of the backplane assembly 32 are commercially available.

Figure 6:
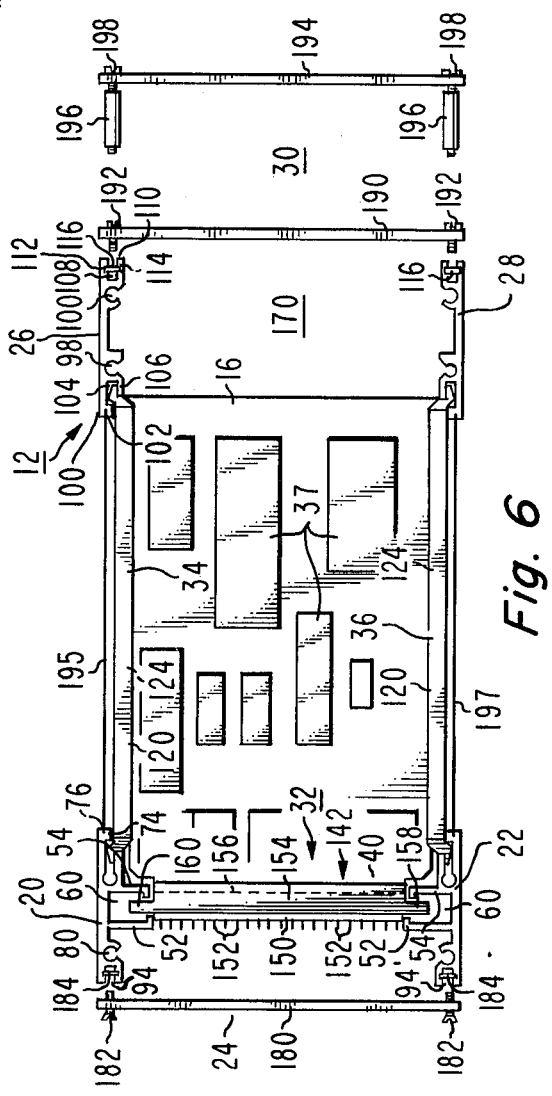
FIG. 6 is an exploded side elevation view of a portion of the housing of FIG. 1 with a side plate removed.

In FIG. 7 element 20 which is also representative of the construction of element 22 will now be described. Elements 20 and 22 may be identical and, in fact, formed from the same extrusion unit having the shape to be described. The extrusion may be formed of aluminum or other materials. The elements 20 and 22 are identical and are mounted as shown in FIG. 6 parallel to each other and in mirror-like fashion. In FIG. 7 element 20 comprises a main wall 50 from which extends two parallel spaced facing side walls 52 and 54. Walls 52 and 54 are perpendicular to wall 50. Walls 52 and 54 form with base wall 58, which is part of wall 50, a channel 60 whose length extends the length of the element 20 in a direction normal to the plane of FIG. 7. Respective facing spaced lips 62 and 64 extend from the free ends of walls 52 and 54. The spacing between lips 62 and 64 has a value which provides a close friction fit for the backplane assembly 32 as will be described in more detail later. Channel 60 has a depth in a direction perpendicular to wall 50 from wall 50 to the region between lips 62 and 64. Extending perpendicular to and from wall 54 is a third channel side wall 66 which is spaced parallel to and faces portion 50' of wall 50. This wall 66 extends the length (perpendicular to the plane of FIG. 7) of element 20. Wall 54 forms the base and the wall 66 and the wall formed by portion 50' form two spaced facing sides of channel 68 which extends the length (perpendicular to the plane of FIG. 7) of element 20. Channel portion 78 is at the base region of channel 68 and has a semicircular section having a restricted opening 72 within channel 68. Semicircular channel 78 receives a self-tapping metal screw extending in a direction perpendicular to the plane of the drawing in FIG. 7 in a known way. Channel 68 has the same length as channel 60 and has a depth perpendicular to wall 54, and thus to the depth of channel 60.

One end 75 of wall 50 is formed with a facing wall 74 spaced from and parallel to wall 50, forming a third channel 76 which is generally parallel to the channel 68 and which extends the length of the element 20. A second semicircular channel 80 having restricted opening 82 is formed by walls 83 and 84 extending from a second portion 50'' of wall 50. Portions 50' and 50'' are joined by base 58. Channel 80 receives a self-tapping metal screw in a direction normal to the plane of the drawing in FIG. 7. Depending from the outer edge of wall 84 is a wall 86 which is spaced from and faces parallel to end portion 88 of wall 50. End portion 88 forms channel 94 with wall 86, channel 94 extending in the direction perpendicular to the drawing in FIG. 7 the length of element 20. A chennel 92 is formed in wall end portion 88 and a channel 90 is formed in wall 86. The channels 90 and 92 face each other and receive a nut strip which is a strip of sheet material with a plurality of spaced holes (not shown), each hole forming a nut which is adapted to receive a corresponding screw in a direction parallel to the plane of the sheet of the drawing. For example, nut strip 184, FIG. 6, is closely received in channels 90 and 92 (FIG. 7) and slid along the length of the element 20 to a desired position for receiving one or more screws 182 used to fasten rear plate 180 to elements 20, 22.

Channel 60 of element 20, FIG. 7, is positioned so that its open area between lips 62 and 64 faces and is opposite the corresponding open area of channel 60, element 22. The channel 60 in elements 20, 22, receives the backplane connector assembly 32 as mentioned above, the channel lengths being parallel. Channels 76 in the different elements are parallel and receive a sheet material top plate 195 or bottom plate 197, FIG. 6. The channel 68 receives a guide 34 (or 36 for element 22), FIG. 6 as will be explained more fully later. The two semicircular channels 78 and 80, as mentioned, receive screws, such as 172, 174, FIG. 1, and therefore can be positioned at locations on the element 20 other than that shown in accordance with a given implementation. For example in FIG. 10 channels 80' of elements 20' and 22' are located within the channels 60' corresponding to channel 60 of element 20. As a result, the length of the wall 50' from channel 94 to wall 52' is foreshortened as can be determined by comparison of the element 20 of FIG. 7 to the element 20' of FIG. 10. The prime numbers of FIG. 10 relate to similar elements in the elements 20, 22 of FIG. 7. One difference between elements 20, 20' is the relocation of the channel 80 to the position of channel 80' as described. Another difference is that in FIG. 10, elements 20' 22', channel 68 has a base wall 67 spaced from wall 54' and extending from wall 50'.

Figure 10:
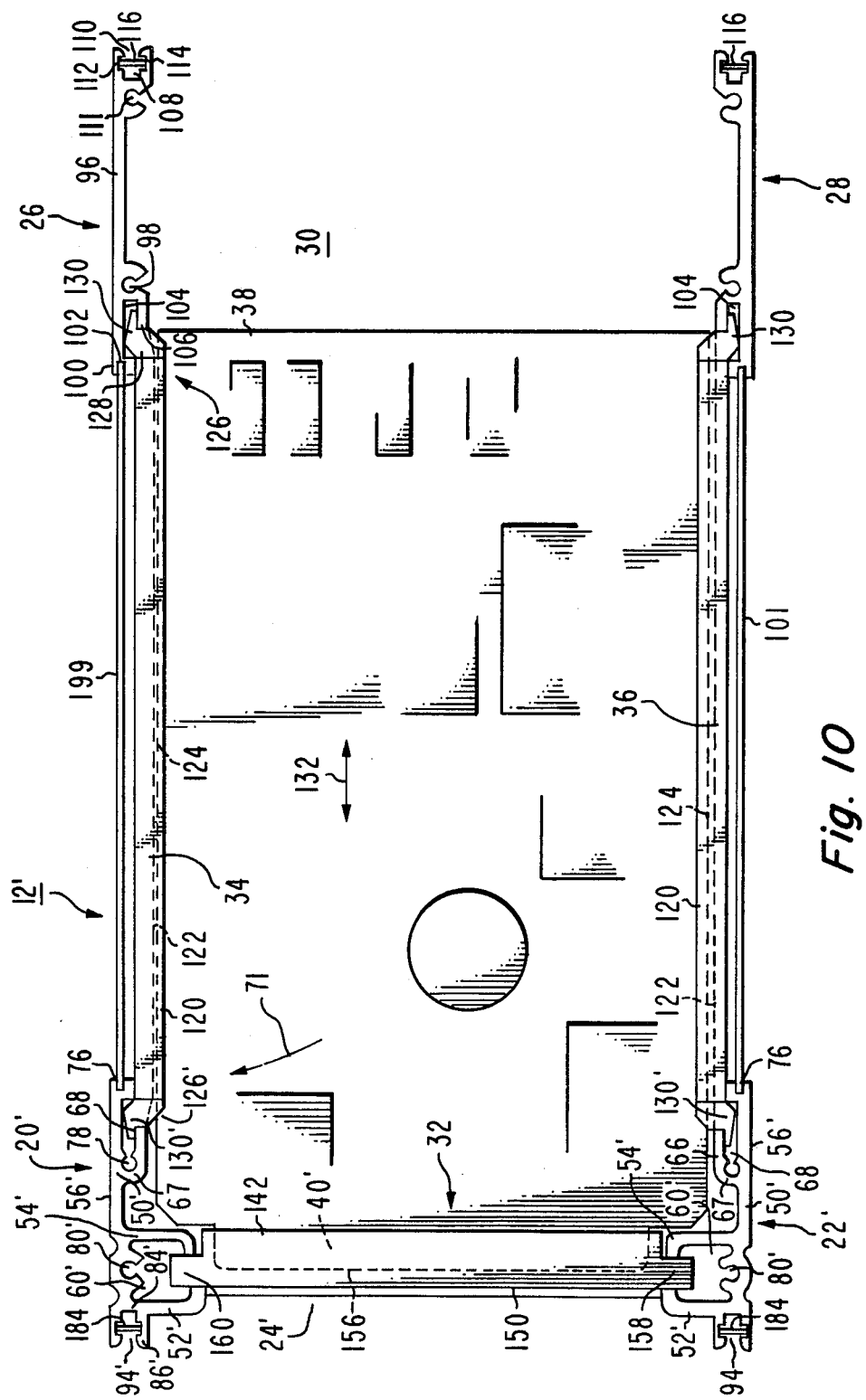
FIG. 10 is a side elevation view of a portion of a second housing assembly similar to the assembly of FIG. 6.

Elements 26 and 28, FIGS. 6 and 10, may be identical and positioned in mirror image fashion. The elements 26 and 28 lie in a plane parallel to the plane of elements 20 and 22 and are positioned at the front end of the housing. The element 28 may be formed from the same extrusion unit as element 26. Since the construction of elements 26 and 28 may be identical, the following description of the element 26 is representative.

In FIG. 10 element 26 comprises a substantially planar side wall 96, which extends in and out of the drawing for a length which is the same as the length of elements 20 and 22, (FIG. 6) or elements 20', 22', (FIG. 10). Circular spaced channels 98 and 100 are formed on one side of the wall 96 as shown and are similar to the circular channel 80 of element 20. Channels 98 and 100 each receive a self-tapping threaded screw inserted in a direction normal to the plane of the sheet of the drawing. The channels 98 and 111 extend for the length of the element 26. End 100 of wall 96 is formed with a channel 102 which is a mirror image of and faces the channel 76 of element 20, FIG. 6. Channel 102 receives an edge of cover plates 199 or 101, FIG. 10 or plates 195, 197, FIG. 6. One side wall of the channel 98, FIG. 10, forms a base wall for channel 104 which has a side wall 106 parallel to wall 96. Channel 104 has a transverse dimension, that is, in the direction from the bottom of the drawing to the top of the drawing, of the same dimension as the channel 68, element 20, FIG. 7. Channel 104 also has a depth to the left and the right of the drawing, FIG. 10, of about the same dimension as the channel 68 to the restricted opening 72, FIG. 7. The other end 110 of wall 96 has a depending wall 114 which is spaced from and faces wall 112 to form a channel 108 similar to the channel 94 of element 20, FIG. 7. The channel 108 has two facing channels such as 90 and 92 of element 20, FIG. 7, for slidably receiving a nut strip 116 of sheet material having a plurality of spaced holes 185, FIG. 1, which is similar to nut strip 184. These holes engage threaded screws. Nut strip 116 is slid into position along the length of the element 26 in a direction normal to the sheet of drawing, FIG. 10. In FIG. 6, the elements 20, 22 are at the housing 12, rear 24 corners and the elements 26, 28 are at the front 30 corners. Elements 20 and 26 lie in a first plane. Elements 22 and 28 line in a second plane parallel to that first plane. The planes in which element pairs 20, 26, and 22, 28 lie are perpendicular to the planes of element pairs 20, 22 and 26, 28.

Guides 34 and 36 may be identical and therefore the description of guide 34 is representative. The guide 34 is commercially available. The guide 34 includes two straight parallel rails 120 and 122 which define a slot 124 therebetween. The slot 124 receives the printed circuit board assembly 38 in directions 132. The tab assembly 126, FIG. 10, extends from one end of guide 34. The construction of tab assembly 126 is identical to the construction of a tab assembly at each end of each guide 34, 36 and therefore the construction of the tab assembly 126 is representative. Tab assembly 126, FIG. 10, includes a body 128 attached to the rails 120, 122 and an offset tab 130 which has a transverse dimension from the bottom of the drawing to the top of the drawing which is closely received in channel 104. Tab 130 tapers toward its extended end so that it can be inserted into channel 104 at any point along the channel by a tilting action. That is, a guide 34 can be attached to element 26 by inserting tab 103 into the channel 104 from a side of the element 26 with the guide 34 tilted from the position shown, e.g., tilted toward the bottom of the sheet, FIG. 10. With the guide 34 tilted, it is then pivoted about tab 126 and channel 104 in direction 71. There is a slight interference fit of the tab 130 in channel 104 during the insertion so that tab 130 snaps in place. The tab assembly 126' at the other end of guide 34 includes a tab 130' which may be identical to tab 130 and is closely received in the channel 68 of element 20 or 20', FIG. 6 or FIG. 10, respectively. Guide 34, tab 126' may also be snapped into channel 68 similarly as described above for tab 126.

The guides 36 which may be identical to the guide 34 are attached to the corresponding channels in elements 22' and 28 in a manner similar to that described above for guides 34. The guide 36 is inserted with its slot 124 aligned with the guide 34 slot 124 for receiving the printed circuit board assembly 38. That is, the slots of guides 34 and 36 for a given printed circuit board assembly are aligned and facing each other in the same plane.

Any number of guides 34 and 36 may be positioned in the elements 20', 22', 26, and 28. However, the several guides 34 or 36 positioned adjacent to one another on each side are spaced by spacer 134, FIGS. 8 and 9. prior to guides 34, 36 being positioned in place, spacers 134 of equal length to elements 20, 22, 26, 28 are slid into the corresponding channels 104, 68, as the case may be.

Figure 8:
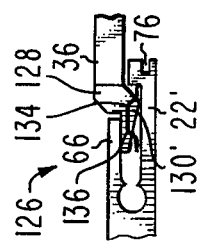
FIG. 8 is an isometric view of a spacer element employed in the embodiment of the present invention.
Figure 9:
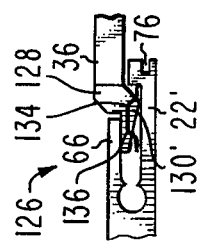
FIG. 9 is an edge sectional view of the spacer element of FIG. 8 employed in the housing of FIG. 6.

In FIG. 8 spacer 134 comprises a strip sheet member which may be thermoplastic material or metal which is formed somewhat as a ladder with offset rungs, as shown. Spacer 134 has two extended sheet-like legs 138, 140 which are coplanar. A set of spaced rungs 135 of like dimension and shape are connected to and between legs 138, 140. Rung 135 has a central member 136 lying in a plane offset from the plane of legs 138, 140. Member 136 is connected to leg 138 by portion 141 and to leg 140 by portion 143. Portions 141, 143 line in planes which intersect the plane of legs 138, 140, and member 136 at an angle. The space 147 between adjacent rungs 135 receives a tab 130, 130' of a guide 34, 36. The offset member 136 and portions 141, 143 of the rung 135 overlie the guide tabs 130, 130', FIGS. 8, 9. Thus, the tabs 130, 130' abut the edges 137 of rungs 135, the rungs serving to space the tabs of adjacent guides. The spacers 134 are cut to a length equal to the length of elements 20, 22, 26, 28 and installed in the channels 104 and 68. As many guides 34 as desired are then snapped into position with their tabs engaged in the channels 104 and 68 and between facing edges 137 of rungs 136, FIG. 8. The guides 36 on the opposite side of the structure 12', FIG. 10 are installed similar to that as described for guides 34.

Figure 5:
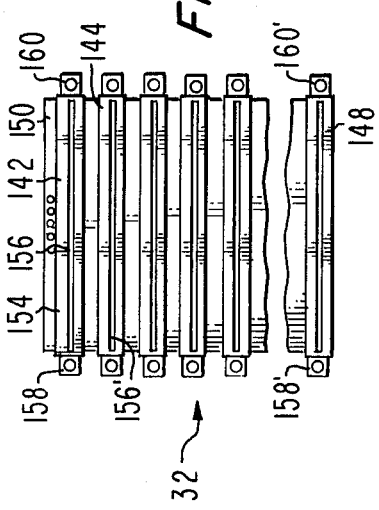
FIG. 5 is a front elevation view of the connector assembly of FIG. 4 taken along lines 5-5 of FIG. 4.

In FIG. 5 the backplane assembly 32, which is rotated 90° from the orientation when in use, to be consistent with the orientation of FIGS. 6 and 10, comprises a plurality of parallel aligned printed circuit board connectors 142, 144, 148 and so on all secured to an insulating printed circuit board 150 which together form a backplane structure. In FIG. 6 the connector 142 is mounted to the printed circuit board 150 with its connector pins 152 protruding from the printed circuit board 150 on a side of the board opposite the connector 142, body 154. The pins 152 of the connectors 142-148 are aligned adjacent to each other, FIG. 6. Connectors 142-148 may be identical.

Representative connector 142, FIGS. 5 and 6, is commercially available and comprises a connector body 154 having a slot 156 for receiving the edge 40 of a printed circuit board assembly 16. Extending from opposite ends of the body 154 are tabs 158 and 160. Tabs 158 and 160 are apertured for receiving mounting screws for ordinarily mounting the connector 142 to its associated printed circuit board. In the present embodiment the apertures of tabs 158 and 160 are not utilized. Tabs 158 and 160 ordinarily are identical and are rectangular members with parallel faces facing toward and away from the viewer in FIG. 5. Tabs 158-158' on the same side of respective connectors 142-148 are aligned in a straight line on one side of the assembly 32. The tabs 160, 160' at the other end of the connectors are aligned in a straight line parallel to the line of the tabs 158, 158'.

The tabs 158-158' are inserted in channel 60 of element 22, FIG. 6, between lips 62, 64. The tabs 160-160' on the opposite side of the connector assembly 32 are inserted in the channel 60 of the element 20. Connector assembly 32 is assembled to the elements 20 and 22 which lie in a plane by sliding the respective tabs into the corresponding channel 60 of the elements 20 and 22, FIG. 6, from an end of the elements 20, 22. The slot 156 of each of the connectors 142-148 faces inwardly and is aligned with the respective slots 124 of the coplanar guides 34, 36. That is, the slots of an adjacent guide 34, 36 and a slot 156 of one of the printed circuit board connectors on the printed circuit board 150 are all aligned in a common plane to receive a flat printed circuit board. For example, in FIG. 1 printed circuit boards 14, 15, and 16 are moved in directions 132 in and out of the structure 12. When the circuit boards are fully inserted into the structure 12 the edge area 40 of the boards, FIG. 10, is received in the appropriate slot 156 of the connectors 142 and so forth.

By making the length of the elements 20, 22, 26, and 28 a given magnitude, a desired number of guides 34, 36 and connectors 142-148 may be assembled thereto. As a result the assembly can be made modular. For example, the length of the elements 20, 22, 26 and 28 may be made such that they can accommodate three circuit boards or ten circuit boards or more or fewer depending on a given implementation. What is important is that the connectors 142-148, FIGS. 4 and 5, are positioned to correspond with the positioning of the respective guides 34, 36 to which a printed circuit board is to be mounted.

In FIG. 2 side plate 44 is fastened with screws 172 to elements 22 and 20 and with screws 174 to elements 26 and 28. Screws 172 are inserted in the channels 78 and 80, FIG. 7. Screws 174 are inserted in the channels 100 and 98 of elements 26 and 28, FIG. 10.

A second side plate 46 which may be identical to plate 44 is fastened to elements 20 and 22 by screws 172' and to elements 26 and 28 by screws 174' in the same channels as the screws 172 and 174, respectively. The plates 44 and 46 hold the guides 36 and 34 and the connector assembly 32 in place.

In FIG. 6 rear plate 180 is secured over the connector assembly 32 by screws 182 which are assembled to sheet material nut strips 184. Front plate 190 is fastened with screws 192 to sheet material nut strips 116 in elements 26 and 28, FIG. 6.

In FIG. 6 an additional transparent electrically insulating plate 190 is shown. In this case plate 194 may be assembled to nut strips 116 using stand-offs 196 between plates 190 and 194 to provide a protective cover from exposed electrical connections which may be attached to the surface of plate 190. Screws 198 pass through the stand-offs 196 and are threaded to strip nuts 116.

Top and bottom plates 195, 197, respectively, are attached to elements 20, 26, FIG. 6, prior to the assembly of the side plates. Plate 195 is slid in place in channel 76 in element 20 and in channel 102 in element 26. Plate 197 is inserted in corresponding channels 76, 102 on the other side of structure 12 in elements 22, 28, respectively. Plates 195, 197 enclose the guides 34, 36 on the top and bottom of the structure 12. Plates 199, 101 in FIG. 10 are similar to plates 195, 197 and are installed similarly.

The resulting structure can be fabricated of preassembled components comprising the elements 20, 22, 26, and 28 of any given length and a plurality of standard components comprising the guides 34, 36 and the plates 44, 46, 180, 190, 195, and 197 with a minimum number of screw type fasteners. Except for the front, rear, and side plates, the remaining frame assembly does not require fasteners, and therefore can be readily assembled with a minimum of hardware components. The connector assemblies 32 can also be fabricated in standard modular sizes, of any number of connectors as desired, as described above.

The connector assembly 32 forms a simple, easy to use backplane assembly in which like pins of each of the connectors may be interconnected by a conductor on the circuit board 150. This can be done, for example, to simplify grounding and circuit connections from one circuit board assembly, such as 16 to another, such as 14 and 15, FIG. 1. The structure described can be mounted on industry standard racks such as 19 inch EIA racks, on backwalls, or may be mounted on flat surfaces. Removable front and rear plates provides front and rear access to internal components. The various sizes can provide a housing which can accommodate a variety of different numbers of printed circuit boards. By merely assembling the right and left side plates, the entire assembly is securely fastened together with no screws or fasteners required for the internal components comprising the circuit board guides, spacers, and the backplane connector assembly.

What is claimed is:

1. A housing for securing and storing at least one printed circuit board, comprising:
    a first pair of like interconnect elements, said elements having like first channels and like second channels, said channels extending generally parallel to each other along the length of said elements;
    a second pair of like interconnect elements, said second pair of elements having like third channels extending along their length;
    means coupled to said first and second pair of elements for securing all of the elements in spaced relation and forming an assembly therewith, said first pair of elements being parallel spaced with said first channels facing each other and generally at one end of said assembly and said second pair of elements being parallel spaced and generally at an end opposite said one end, with a first of said first pair of elements generally coplanar with a first of said second pair of elements and a second of said first pair of elements generally coplanar with a second of said pair of elements, and with said second channels of said first pair of elements facing said third channels;
    guide means including means dimensioned for slidably receiving said printed circuit board, said guide means including first tab means engaged in said second and third channels for securing the guide means to said elements; and
    backplane means including at least one printed circuit board connector adapted to engage said received printed circuit board, and a printed circuit board attached to the one connector, said connector including second tab means dimensioned to frictionally engage said first elements in said first channels to align the connector and printed circuit board along said first channels relative to said guide means.

2. The combination of claim 1 wherein said second tab means includes first and second tabs at opposite ends of said connector, said first channels and said tabs being dimensioned such that said first channels slidably receive a corresponding different one of said first and second tabs.

3. The combination of claim 2 wherein said guide means includes first and second printed circuit board guides each having a slot dimensioned for receiving said printed circuit board therein, said first guide including third and fourth tab means respectively received in said second and third channels of one of said first and second pair of elements, said second guide including fifth and sixth tab means respectively received in said second and third channels of the other of said first and second pair of elements.

4. The combination of claim 3 wherein said backplane means includes a plurality of said circuit board connectors and said printed circuit board includes a planar insulating board, each connector secured to the planar insulating board with the tabs of the different connectors aligned, the first tabs at one connector end being received in said first channel of one element of the first pair and the second tabs at the other connector end being received in the first channel of the other element of the first pair.

5. The combination of claim 4 wherein said guides correspond to a connector, said housing including positioning means received in said second and third channels for aligning said slots of said guide pair with the corresponding connector.

6. An interconnect structure for interconnecting a received printed circuit board assembly comprising:
    a backplane assembly comprising a printed circuit board and an array of printed circuit board connectors, each said connectors including a pin interconnected with a conductor of that printed circuit board to form an integral assembly therewith, said connectors each including tab means at each connector end, the tab means at each end being aligned; and
    a pair of interconnect elements, each element comprising:

a main wall member;

first and second spaced side wall members extending perpendicular from said main wall member to form a first channel adapted to slidably receive said aligned tab means of one connector end of said backplane assembly to thereby secure said backplane printed circuit board to said interconnect elements; and a third side wall member extending perpendicular to one of said first and second side wall members and parallel to a portion of said main wall member to form a second channel having a depth extending generally perpendicular to the depth of said first channel.

7. The structure of claim 6 in which each said element has third and fourth channels at opposite edges of the main wall member.

8. The structure of claim 7 further including nut strip means in one of said third and fourth channels.

9. A housing for receiving a printed circuit board comprising:

a backplane assembly comprising a printed circuit board having a conductor thereon and at least one printed circuit board connector having a pin connected to said conductor, said pin attaching said connector to said backplane board;

first and second like channelized elements, said first and second elements secured in a spaced mirror-like position at one end of said housing adapted to closely slidably receive said at least one printed circuit board connector in a channel of each element to thereby secure said backplane assembly to said elements;

third and fourth channelized like elements, said third and fourth elements secured in a spaced mirror-like position at an end of said housing opposite the one end;

at least one slotted first circuit board guide received in a channel of said first element and in a channel of said third element;

means coupled to said first and third elements to align the slot of said first guide with said connector;

at least one slotted second circuit board guide received in a channel of said second element and in a channel of said fourth element; and means coupled to said second and fourth elements to align the slot of the second guide with said first guide and said connector.

10. The housing of claim 9 further including plate means attached to said elements for enclosing said guides and connector.

11. The housing of claim 9 wherein each said elements includes an additional channel for receiving a chassis enclosing plate, one plate being received in the additional channel of one of said first and second elements and in the additional channel of one of said third and fourth elements to which the first or second guides are coupled for covering that guide.

12. The housing of claim 9 including a plurality of first guides and a like plurality of second guides and a like plurality of said connectors, a first and second guide and a connector being aligned in a common plane, and spacer means for spacing said guides in said common planes, said spacer means being located in said guide channels in said elements.

13. A housing for securing and storing at least one printed circuit board, comprising:

a first pair of like interconnect elements, said elements having like first channels and like second channels, said channels extending generally parallel to each other along the length of said elements;

a second pair of like interconnect elements, said second pair of elements having like third channels extending along their length;

means coupled to said first and second pair of elements for securing the elements in spaced relation and forming an assembly therewith, said first pair of elements being parallel spaced with said first channels facing each other and generally at one end of said assembly and said second pair of elements being parallel spaced and generally at an end opposite said one end, with a first of said first pair of elements generally coplanar with a first of said second pair of elements and a second of said first pair of elements generally coplanar with a second of said pair of elements, and with said second channels of said first pair of elements facing said third channels;

guide means adapted for slidably receiving said printed circuit board, said guide means including tab means engaged in said second and third channels for securing the guide means to said elements and guide positioning means received in said second and third channels for positioning said guide means relative to said elements; and backplane means including connector means engaged with said first channels and means for aligning said connector means with said guide means, said connector means including a printed circuit board connector having an opening for receiving a printed circuit board edge therein and first and second tabs at opposite ends of said connector, said first channels slidably receiving a different one of said tabs;

said guide means including first and second printed circuit board guides each having a slot for receiving said printed circuit board therein, said first guide including first and second tab means respectively received in said second and third channels of one of said first and second pair of elements, said second guide including first and second tab means respectively received in said second and third channels of the other of said first and second pair of elements;

said backplane means including a plurality of said circuit board connectors and a planar insulating board, each connector secured to the planar insulating board with the tabs of the different connectors aligned, said tab at one connector end being received in said first channel of one element of the first pair and the tab at the other connector end being received in the first channel of the other element of the first pair;

said guides each having a slot, a pair of guides corresponding to a connector, said positioning means aligning said slots of said guide pair with the opening of a corresponding connector.

14. An interconnect element for interconnecting guides for receiving printed circuit board assemblies and a backplane assembly comprising:

a main wall member;

first and second spaced side wall members extending perpendicular from said main wall member to form a first channel adapted to receive said backplane assembly;

a third side wall member extending perpendicular to one of said first and second side wall members and parallel to a portion of said main wall member to form a second channel having a depth extending generally perpendicular to the depth of said first channel, said second channel adapted to receive said guides;

said main wall member having third and fourth channels at opposite edges; and nut strip means in one of said third and fourth channels.

15. The structure of claim 14 wherein said main wall member includes aperture means for receiving at least one fastening device.

16. A housing for receiving a printed circuit board comprising:

at least one printed circuit board connector;

first and second like channelized elements, said first and second elements secured in a spaced mirror-like position at one end of said housing and adapted for slidably receiving said at least one printed circuit board connector in a channel of each element;

third and fourth channelized like elements, said third and fourth elements secured in a spaced mirror-like position at an end of said housing opposite the one end;

at least one slotted first circuit board guide received in a channel of said first element and in a channel of said third element;

means coupled to said first and third elements to align the slot of said first guide with said received connector;

at least one slotted second circuit board guide received in a channel of said second element and in a channel of said fourth element; and means coupled to said second and fourth elements to align the slot of the second guide with said first guide;

each said elements including an additional channel for receiving a chassis enclosing plate, one plate being received in the additional channel of one of said first and second elements and in the additional channel of one of said third and fourth elements to which the first or second guides are coupled for covering that guide.

17. The housing of claim 16 wherein each said elements include a further channel for securing an additional assembly enclosing plate thereto, the one additional plate being positioned at said one end, a second additional plate being positioned at said opposite end.

* * * * *